United States Patent
Yi et al.

(10) Patent No.: US 7,571,358 B2
(45) Date of Patent: Aug. 4, 2009

(54) ERROR PROCESSING APPARATUS AND METHOD FOR WIRELESS COMMUNICATION SYSTEM

(75) Inventors: Seung June Yi, Seoul (KR); Young Dae Lee, Hanam-si (KR); Sung Duck Chun, Seoul (KR)

(73) Assignee: LG Electronics Inc., Seoul (KR)

( * ) Notice: Subject to any disclaimer, the term of this patent is extended or adjusted under 35 U.S.C. 154(b) by 427 days.

(21) Appl. No.: 10/816,247

(22) Filed: Mar. 31, 2004

(65) Prior Publication Data
US 2004/0199850 A1    Oct. 7, 2004

(30) Foreign Application Priority Data
Apr. 1, 2003  (KR) ............ 10-2003-0020533

(51) Int. Cl.
*G06F 11/00* (2006.01)
(52) U.S. Cl. ........................................ 714/48
(58) Field of Classification Search .......... 714/45, 714/82
See application file for complete search history.

(56) References Cited

U.S. PATENT DOCUMENTS

| | | | | |
|---|---|---|---|---|
| 6,675,016 | B2 * | 1/2004 | Lucidarme et al. | 455/452.2 |
| 6,915,473 | B2 * | 7/2005 | Bolourchi et al. | 714/755 |
| 2002/0001314 | A1 | 1/2002 | Yi et al. | |
| 2003/0211846 | A1 * | 11/2003 | Nagpal et al. | 455/434 |
| 2004/0097196 | A1 * | 5/2004 | Ben Rached et al. | 455/67.11 |
| 2004/0153852 | A1 * | 8/2004 | Wu | 714/43 |

FOREIGN PATENT DOCUMENTS

| | | |
|---|---|---|
| JP | 06-350611 | 12/1994 |
| JP | 2002-026984 | 1/2002 |
| JP | 2004-523947 A | 8/2004 |
| KR | 10-2002-0014971 A | 2/2002 |
| WO | WO 03/005657 A1 | 1/2003 |
| WO | WO 03/026168 A1 | 3/2003 |

OTHER PUBLICATIONS

Holma, Harri; Toskala, Antti. WCDMA for UMTS: Radio Access for Third Generation Mobile Communications, Apr. 2001, Wiley, pp. 117-127.*

(Continued)

*Primary Examiner*—Scott T Baderman
*Assistant Examiner*—Paul F. Contino
(74) *Attorney, Agent, or Firm*—McKenna Long & Aldridge LLP

(57) ABSTRACT

An apparatus and method for processing data in a receiver used in a wireless communication system is provided. The data processing method uses the receiver apparatus comprising a medium access control (MAC) layer and a radio link control (RLC) layer for processing data units. The data processing comprises communicating a data unit and a cyclic redundancy code (CRC) check result associated with the data unit from the MAC layer to the RLC layer; examining in the RLC layer that the CRC check result sent from the MAC layer that indicates whether the data unit has an error; and discarding the data unit when the data unit has error and when an error handling scheme is not provided.

19 Claims, 9 Drawing Sheets

OTHER PUBLICATIONS

Cseh, C. et al. Communication Architecture: Contact No. IST-2000-28285: Deliverable D6, Oct. 28, 2002, CarTALK 2000 Consortium, pp. 88-90.*

Radio Link Control (RLC) protocol specification. 3GPP TS 25.322 V4.4.0 (Mar. 2002). 3GPP Organizational Partners. Mar. 2002. retrieved on [Jun. 14, 2007]. Retrieved from the Internet: <URL: http://www.3gpp.org/ftp/Specs/html-info/25322.htm>, pp. 53-54.*

UTRAN Iu interface user plane protocols. 3GPP TS 25.415 V3.7.0 (Jun. 2001). 3GPP Organizational Partners. Jun. 2001. retrieved on [Jun. 14, 2007]. Retrieved from the Internet: <URL: http://www.3gpp.org/ftp/Specs/html-info/25415.htm>, p. 12.*

AMR speech codec. 3GPP TS 26.071 V4.0.0 (Mar. 2001). 3GPP Organizational Partners. Mar. 2001. retrieved on [Jun. 14, 2007]. Retrieved from the Internet: <URL: http://www.3gpp.org/ftp/Specs/html-info/26071.htm>, p. 6.*

Radio Link Control (RLC) protocol specification. 3GPP TS 25.322 V4.4.0 (Mar. 2002). 3GPP Organizational Partners. Mar. 2002. retrieved on [Jun. 14, 2007]. Retrieved from the Internet: <URL: http://www.3gpp.org/ftp/Specs/html-info/25322.htm>, pp. 20-21.*

3GPP TS 25.321 v4.8.0, Mar. 2003, p. 19-21, 28, URL, http://www.3gpp.org/ftp/Specs/archive/25_series/25.321.25321-480.zip.

3GPP TS 25.321 v4.8.0, Mar. 2003, p. 20-22,54-56, URL, http://www.3gpp.org/ftp/Specs/archive/25_series/25.322.25322-480.zip.

ASUSTeK, R2-020914, 3GPP TSG-RAN WG2#29, May 2002. URL, http://www.3gpp.org/ftp/tsg_ran/WG2_RL2/TSGR2_29/Docs/Zips/R2-020914.zip.

Holma, Harri and Toskala, Antti, ECDMA for UMTS—Radio Access for Third Generation Mobile Communication, 2002, Chapter 7, John Wiley & Sons, Ltd. (Attached is the Chinese Language translation version of the copy of the reference as provided by the Chinese Intellectual Property Office, and the corresponding English language original version.).

* cited by examiner

ERROR PROCESSING APPARATUS AND METHOD FOR WIRELESS COMMUNICATION SYSTEM

CROSS-REFERENCE TO RELATED APPLICATIONS

Pursuant to 35 U.S.C. § 119(a), this application claims the benefit of earlier filing date and right of priority to Korean Application No. 2003-20533, filed on Apr. 1, 2003, the contents of which is hereby incorporated by reference herein in its entirety.

BACKGROUND OF THE INVENTION

1. Field of the Invention

The present invention relates to a data processing apparatus and method in a wireless communication system and, more particularly, to an error processing apparatus and method for processing data unit associated with, for example, AMR (Adaptive Multi Rate) codec.

2. Description of the Related Art

A universal mobile telecommunication system (UMTS) is a European-type, third generation IMT-2000 mobile communication system that has evolved from a European standard known as Global System for Mobile communications (GSM). UMTS is intended to provide an improved mobile communication service based upon a GSM core network and wideband code division multiple access (W-CDMA) wireless connection technology.

In December 1998, a Third Generation Partnership Project (3GPP) was formed by the ETSI of Europe, the ARIB/TTC of Japan, the T1 of the United States, and the TTA of Korea. The 3GPP creates detailed specifications of UMTS technology. In order to achieve rapid and efficient technical development of the UMTS, five technical specification groups (TSG) have been created within the 3GPP for standardizing the UMTS by considering the independent nature of the network elements and their operations.

Each TSG develops, approves, and manages the standard specification within a related region. Among these groups, the radio access network (RAN) group (TSG-RAN) develops the standards for the functions, requirements, and interface of the UMTS terrestrial radio access network (UTRAN 100), which is a new radio access network for supporting W-CDMA access technology in the UMTS.

FIG. 1 illustrates an exemplary basic structure of a general UMTS network. As shown in FIG. 1, the UMTS is roughly divided into a terminal or user equipment (UE) 50, a UTRAN 100, and a core network (CN) 200.

The UTRAN 100 includes one or more radio network sub-systems (RNS) 110. Each RNS 110 includes a radio network controller (RNC) 111 and a plurality of Node-Bs 112 managed by the RNC 111. The RNC 111 handles the assignment and management of radio resources and operates as an access point with respect to the core network 200.

The Node-Bs 112 receive information sent by the physical layer of the terminal 50 through an uplink, and transmit data to the terminal 50 through a downlink. The Node-Bs 112 operate as access points of the UTRAN 100 for the terminal 50.

The services provided to a specific terminal 50 are roughly divided into the circuit switched (CS) services and the packet switched (PS) services. For example, a general voice conversation service is a circuit switched service, while a Web browsing service via an Internet connection is classified as a packet switched (PS) service.

For supporting circuit switched services, the RNCs 111 are connected to the MSC 210 of the core network 200, and the MSC 210 is connected to the GMSC 220 that manages the connection with other networks.

For supporting packet switched services, the RNCs 111 are connected to the SGSN 230 and the GGSN 240 of the core network 200. The SGSN 230 supports the packet communications with the RNCs 111 and the GGSN 240 manages the connection with other packet switched networks, such as the Internet.

Various types of interfaces exist to allow the network components to transmit and receive information to and from each other for mutual communication. An interface between the RNC 111 and the core network 200 is defined as an Iu interface. In particular, the Iu interface between the RNCs 111 and the core network 200 for packet switched systems is defined as "Iu-PS," and the Iu interface between the RNCs 111 and the core network 200 for circuit switched systems is defined as "Iu-CS."

FIG. 2 illustrates a structure of a radio interface protocol between the terminal 50 and the UTRAN 100 according to the 3GPP radio access network standards. As shown in FIG. 2, the radio interface protocol has horizontal layers comprising a physical layer, a data link layer, and a network layer, and has vertical planes comprising a user plane (U-plane) for transmitting user data and a control plane (C-plane) for transmitting control information.

The user plane is a region that handles traffic information with the user, such as voice or Internet protocol (IP) packets. The control plane is a region that handles control information for an interface with a network, maintenance and management of a call, and the like.

The protocol layers in FIG. 2 can be divided into a first layer (L1), a second layer (L2), and a third layer (L3) based on the three lower layers of an open system interconnection (OSI) standard model.

The first layer (L1), namely, the physical layer, provides an information transfer service to an upper layer by using various radio transmission techniques. The physical layer is connected to an upper layer called a medium access control (MAC) layer, via a transport channel. The MAC layer and the physical layer exchange data via the transport channel.

The second layer (L2) includes a MAC layer, a radio link control (RLC) layer, a broadcast/multicast control (BMC) layer, and a packet data convergence protocol (PDCP) layer.

The MAC layer handles mapping between logical channels and transport channels and provides allocation of the MAC parameters for allocation and re-allocation of radio resources. The MAC layer is connected to an upper layer called the radio link control (RLC) layer, via a logical channel.

Various logical channels are provided according to the type of information transmitted. In general, a control channel is used to transmit information of the control plane and a traffic channel is used to transmit information of the user plane.

A logical channel may be a common channel or a dedicated channel depending on whether the logical channel is shared. Logical channels include a dedicated traffic channel (DTCH), a dedicated control channel (DCCH), a common traffic channel (CTCH), a common control channel (CCCH), a broadcast control channel (BCCH), and a paging control channel (PCCH). The BCCH provides information including information utilized by a terminal 50 to access a system. The PCCH is used by the UTRAN 100 to access a terminal 50.

The MAC layer is connected to the physical layer by transport channels and can be divided into a MAC-b sub-layer, a MAC-d sub-layer, a MAC-c/sh sub-layer, and a MAC-hs sub-layer according to the type of transport channel being managed. The MAC-b sub-layer manages a BCH (Broadcast Channel), which is a transport channel handling the broadcasting of system information. The MAC-c/sh sub-layer manages a common transport channel, such as a forward access channel (FACH) or a downlink shared channel (DSCH), which is shared by a plurality of terminals. The MAC-d sub-layer manages a dedicated channel (DCH), which is a dedicated transport channel for a specific terminal 50.

The RLC layer supports reliable data transmissions and performs segmentation and concatenation on a plurality of RLC service data units (RLC SDUs) delivered from an upper layer. When the RLC layer receives the RLC SDUs from the upper layer, the RLC layer adjusts the size of each RLC SDU in an appropriate manner based upon processing capacity and then creates data units by adding header information thereto. The data units, called protocol data units (PDUs), are transferred to the MAC layer via a logical channel. The RLC layer includes a RLC buffer for storing the RLC SDUs and/or the RLC PDUs.

Each RLC PDU transferred to the MAC layer is called a MAC SDU. The terms "MAC SDU" and "RLC PDU" are synonymous. The MAC layer may generate a MAC PDU by adding a header to the MAC SDU. The MAC layer transmits the MAC PDU to the physical layer through a suitable transport channel.

FIG. 3 illustrates a format of the MAC PDU. The MAC layer identifies the UEs 50 and the logical channels. There are two reasons for identification. First, the UEs 50 must be distinguished from one another since many UEs share a common transport channel. Second, the logical channels must be distinguished from one another because logical channel multiplexing is performed. With regard to the uplink, the receiving end (i.e., the UTRAN 100) cannot determine which UE 50 sent the data units nor which logical channel was used to send the data units without any identification.

The MAC layer adds one or more identification parameters to form a header of the MAC PDU; a TCTF (target channel type field), a UE-ID type, a UE-ID, and/or a C/T (Control/Traffic) field. In the related art, a MAC header is added to each MAC SDU (Service Data Unit) within a MAC PDU such that MAC SDUs that are transmitted during the same TTI (transmission time interval) have different MAC headers added thereto.

Identification of the UE 50 (i.e., a UE-ID field) is necessary when a dedicated logical channel (such as DCCH or DTCH) is mapped to a common transport channel (such as the RACH, FACH, CPCH, DSCH or USCH). To identify the UE 50, the MAC layer may add a radio network temporary identity (RNTI), which is one type of UE identification, to the UE-ID field of the header. There are three types of RNTIs; a U-RNTI (UTRAN RNTI), a C-RNTI (Cell RNTI), and a DSCH-RNTI. Thus, a UE-ID type field that indicates the type of RNTI added is also transmitted as part of the header.

There are two types of identifications for a logical channel; a TCTF and a C/T field. The TCTF is required for the transport channel when a dedicated logical channel (such as a DCCH and DTCH) is mapped together with other logical channels.

Referring to FDD (Frequency Division Duplex), the TCTF for the FACH identifies the mapped logical channel as a BCCH, a CCCH, or a CTCH, or as a dedicated logical channel (DCCH or DTCH), while the TCTF for the RACH identifies the mapped logical channel as a CCCH or a dedicated logical channel. However, the TCTF does not identify the particular type of dedicated logical channel that was used.

The identification of a dedicated logical channel is provided by the C/T field. The C/T field is required because, unlike other logical channels, several dedicated logical channels can be mapped to one transport channel. Each of the dedicated logical channels mapped to one transport channel has a logical channel identifier, which is used as the C/T field value. However, if only one dedicated logical channel is mapped to one transport channel, the C/T field is not necessary.

Table 1 below shows the different identifiers of a MAC header that are used according to the mapping relationship between logical channels and transport channels for FDD. In Table 1, a C/T field exists when several dedicated logical channels (DCCH or DTCH) are mapped. Also, "N" indicates that there is no header, "-" indicates that there is no mapping relationship, and "UE-ID" indicates that both a UE-ID field and a UE-ID type field exist. A UE-ID field always exists together with a UE-ID type field.

TABLE 1

|  | DCH | RACH | FACH | DSCH | CPCH | BCH | PCH |
|---|---|---|---|---|---|---|---|
| DCCH or DTCH | C/T | TCTF UE-ID C/T | TCTF UE-ID C/T | UE-ID C/T | UE-ID C/T | — | — |
| BCCH | — | — | TCTF | — | — | N | — |
| PCCH | — | — | — | — | — | — | N |
| CCCH | — | TCTF | TCTF | — | — | — | — |
| CTCH | — | — | TCTF | — | — | — | — |

The RLC layer will be explained in more detail as follows.

A basic function of the RLC layer is to guarantee the quality of service (QoS) of each radio bearer (RB) and their corresponding data transmissions. Since the RB service is a service that the second layer of the radio protocol provides to higher layers, the entire second layer affects the QoS. In particular, the RLC layer has significant influence on the QoS.

The RLC provides an independent RLC entity for each RB in order to guarantee the particular QoS of the RB. Three RLC modes are provided to support various types of QoS; a transparent mode (TM), an unacknowledged mode (UM), and an acknowledged mode (AM). Since the three RLC modes (TM, UM, AM) support different QoS requirements, there are differences in their operation and the specific functions performed by each. The particular RLC for each mode is referred to as TM RLC, UM RLC, and AM RLC.

In the transparent mode (TM), a TM RLC adds no protocol overhead to the RLC SDU that is transferred from a higher (upper) layer such that the TM RLC lets the SDU pass "transparently." Because data processing time at the TM RLC is short, real-time circuit data transmissions, such as voice and streaming data in the circuit service domain (CS domain), are handled in the user plane. Because there is no protocol overhead within the TM RLC, uplink transmission of RRC messages from an unspecified terminal 50 and downlink transmission of RRC messages that are broadcast to all terminals (UE) 50 within a cell are handled in the control plane,.

Unlike the transparent mode, protocol overhead is added at the corresponding RLC in a non-transparent mode. Non-transparent modes are divided into an unacknowledged mode (UM) and an acknowledged mode (AM). Unacknowledged mode provides no reception acknowledgement for the transferred data, while acknowledged mode provides acknowledgement for the transferred data.

In unacknowledged mode, a UM RLC adds a PDU header including a sequence number (SN) to each PDU that is transferred, thereby allowing the receiving side to identify which PDUs were lost during transmission. The user plane handles broadcast/multicast data transmissions or real-time packet data transmissions, such as voice (e.g., VoIP) and streaming data in the packet service domain (PS domain). The control plane handles transmission of those RRC messages, among all RRC messages delivered to a specific terminal 50 or terminal group within a cell region, that need no acknowledgement response.

As in UM, a PDU header including SN is added to construct a PDU in acknowledged mode. However, unlike UM, a receiving side provides reception acknowledgement of the PDU sent from a transmitting side. In AM, the receiving side provides acknowledgement in order to request re-transmission of any PDUs that have not been properly received. This function of re-transmission is the distinguishing characteristic of an AM RLC. The object of an AM RLC is to guarantee error-free data transfers through re-transmissions. To achieve error-free data transfers, the user plane handles transmission of non-real-time packet data, such as TC/IP in the PS domain, and the control plane handles transmission of those RRC messages, among all the RRC messages transmitted to a specific terminal 50, that require acknowledgement.

When data is received from a peer (i.e., another party) through a wireless section, the physical layer performs a CRC (Cyclic Redundancy Code) check on data blocks to determine whether there is an error in each data block. If an error is detected, the physical layer transfers the CRC error information together with a corresponding data block to the MAC layer.

Upon receiving a MAC PDU together with the CRC error information from the physical layer, the MAC layer determines that the corresponding PDU is an erroneous PDU and discards the corresponding MAC PDU. If there is no CRC error information on the MAC PDU, the MAC layer transfers the MAC PDU to the RLC layer as soon as it is received.

Since data with a CRC error is discarded in the MAC layer, when RLC PDUs are transferred from the MAC layer, the RLC layer considers them as normal PDUs and processes the PDUs according to a normal PDU processing procedure.

The above-described data processing procedure follows initial standards. Data processing procedures of the MAC layer and the RLC layer have been modified to support an adaptive multi rate (AMR) codec. An AMR codec is a voice communication (speech) codec of the UMTS standardized by ETSI that applies a bit rate allocation between a voice and a channel coding to optimize speech quality in various wireless channel states. In an AMR codec, the received data is used even if the data has an error. If the received data is usable by the AMR codec, but is discarded only because it has a CRC error, wired/wireless resources are wasted. Accordingly, in order to effectively support the AMR codec, operations of the MAC layer and the RLC layer are modified.

If the MAC PDU transferred from the physical layer contains a CRC error, the MAC layer transfers the corresponding PDU to the RLC layer. When the MAC layer transfers the PDU containing a CRC error to the RLC layer, it informs the RLC layer of the existence of the CRC error so that the RLC layer can suitably process the corresponding PDU. However, this process indicates only that there is an error in the PDU and fails to indicate which part of the PDU is erroneous.

If a received MAC PDU containing a CRC error includes a header, the MAC layer cannot rely on the header of the received MAC PDU because it may be erroneous. Because the header may be erroneous, the MAC layer cannot check whether the MAC PDU has reached the intended destination (or a target UE 50) nor determine through which logical channel to the RLC layer it is to transfer the MAC SDU included in the MAC PDU. Therefore, the MAC layer discards the corresponding MAC PDU.

If the RLC layer is in the TM state and a PDU received from the MAC layer contains a CRC error, the RLC layer operates according to a pre-set value of a variable (for example, error handling scheme) for processing data with errors, referred to as a "delivery of erroneous SDUs." The delivery of erroneous SDUs is not set in every TM RLC, but rather is set only when a logical channel connected to the TM RLC is a dedicated traffic channel (DTCH).

The delivery of erroneous SDUs is set for a TM RLC using the DTCH and has three possible pre-set values; no, yes, and no detect. The pre-set values of delivery of erroneous SDUs are set by the RRC at an initial stage of setting a RB and the RRC transfers the information to the MAC layer. The RLC layer processes the error-containing PDU according to a value set for the delivery of erroneous SDUs.

If the delivery of erroneous SDUs is set as "no," the TM RLC checks the CRC error information transferred together with the PDU from the MAC layer. If the corresponding PDU is contains an error, the TM RLC discards the corresponding PDU immediately.

If the delivery of erroneous SDUs is set as "yes," the TM RLC checks the CRC error information transferred together with the PDU from the MAC layer. If the corresponding PDU contains an error, the TM RLC informs an upper layer that the PDU contains an error when transmitting the PDU to the upper layer.

If the delivery of erroneous SDUs is set as "no detect," the TM RLC does not check the CRC error information which has been received together with the PDU from the MAC layer and processes the PDU containing the error as a normal PDU and transfers it to the upper layer.

FIG. 4 is a flow chart of a related art data processing method 200 of the MAC layer.

When the MAC PDU is transferred from a lower layer (step S210), the MAC layer checks whether there is a CRC error in the received MAC PDU (step S220).

If the received MAC PDU does not have an error, the MAC layer processes the MAC PDU according to a normal processing procedure (step S230). If, however, there is an error in the MAC PDU, the MAC layer checks whether there is a MAC header in the received MAC PDU (step S240).

If there is no MAC header in the received MAC PDU, the MAC layer processes the MAC PDU according to the normal processing procedure (step S230). If there is a MAC header in the MAC PDU, the MAC layer discards the MAC PDU (step S250).

FIG. 5 is a flow chart of a related art data processing method 300 of the RLC layer.

When an RLC PDU is transferred from the MAC layer (step S310), the RLC layer checks whether a variable (delivery of erroneous SDUs) for processing error data has been set (step S320).

If the variable has been set, the RLC layer processes a received RLC PDU according to a set error data processing procedure (step S340). If the variable has not been set, the RLC layer processes the received RLC PDU according to a normal processing procedure (step S330).

When the MAC layer and the RLC layer process the PDU in the above-described manner, the MAC layer transfers a corresponding MAC PDU to the RLC layer even if there is an error in the MAC PDU received from the physical layer as long as there is no MAC header in the MAC PDU. If there is no header in the MAC PDU, the transport channel and the logical channel are mapped in a 1:1 ratio.

For example, there are various channel combinations such DTCH-DCH, DCCH-DCH, PCCH-PCH and BCCH-BCH. Among them, only the DTCH-DCH combination is related to the AMR codec. The variable (delivery of erroneous SDUs) is set and the AMR codec uses data with a CRC error only when the RLC layer is in the TM state and data transmission is made through the DTCH-DCH channel combination.

Though not related to the AMR codec, a MAC PDU containing an error can be transferred to the RLC layer when the RLC layer is in the TM state and data transmission is made through the DCCH-DCH, PCCH-PCH or BCCH-BCH channel combination. Furthermore, a MAC PDU containing an error can be transferred to the RLC layer when the RLC layer is in an AM state or in an UM state and data transmission is made through the DTCH-DCH or DCCH-DCH channel combination. In these situations, because the RLC layer is not related to the AMR codec, the variable (delivery of erroneous SDUs) is not set and the RLC layer handles the data containing a CRC error as normal data and processes it. When the RLC layer handles the data containing a CRC error (i.e., CRC error data) as normal data, problems may arise.

When the RLC layer is in the TM state, the data transferred through the DCCH, PCCH and BCCH is the data that the RRC layer uses to manage radio resources. If the TM RLC transfers CRC error data transferred through such channels to the RRC layer, the TM RLC operates properly. However, the CRC error data transferred to the RRC layer may cause the RRC layer to malfunction or cause a communication error if the RRC layer uses an incorrect variable.

Furthermore, when the RLC layer is in the AM state or in the UM state, the existence of an RLC header may cause problems in the RLC layer. The AM RLC or UM RLC codes data using the SN included in the header and updates its own security environment set information. If there is an error in the SN, coding cannot be performed properly and synchronization of the security environment set information between the terminal 50 and the UTRAN 100 cannot be properly achieved. Restoration of coded data transmitted thereafter would not be possible, leading to communication errors.

Moreover, the PDU header of the AM RLC or UM RLC has information regarding the boundary surfaces (regions) of the SDU included in the PDU. If the CRC error data is related to the SDU boundary surface information, the RLC layer cannot reconstruct the RLC SDU to its original form and serious communication errors may occur.

SUMMARY OF THE INVENTION

An object of the present invention is to provide a data processing method for supporting a codec that determines whether detected error data is related to the codec. The error data is transferred to an upper layer only when it is related to the codec.

In one aspect of the invention, a data processing method is provided which determines whether error data transferred to a specific protocol layer is to be provided to a codec. If the transferred data is to be provided to the codec, the data is processed according to an error data processing procedure. If the transferred data is not to be provided to a codec, the data is discarded.

In a preferred embodiment, a method of processing data in a receiver apparatus used in a wireless communication system is provided. The data processing method uses the receiver apparatus comprising a medium access control (MAC) layer and a radio link control (RLC) layer for processing data units. The method comprises the steps of: communicating a data unit and a cyclic redundancy code (CRC) check result associated with the data unit from the MAC layer to the RLC layer; examining in the RLC layer that the CRC check result sent from the MAC layer that indicates whether the data unit has an error; and discarding the data unit when the data unit has error and when an error handling scheme is not provided. Preferably, the error handling scheme comprises an instruction associated with a delivery of erroneous SDU. The data unit comprises a protocol data unit.

According to one aspect of the invention, when the data unit has error by examining the CRC check result and when the error handling scheme is provided, then the error handling scheme indicates one of deliver the data unit to a higher layer with an error indication, discard the data unit, and deliver the data unit to a higher layer without an error indication.

According to another embodiment of the invention, a method of processing data in a receiver apparatus comprises communicating a data unit and a cyclic redundancy code (CRC) check result associated with the data unit from the MAC layer to the RLC layer; determining in the RLC layer that the CRC check result indicates the data unit has an error; and processing the data unit in accordance with one of a first manner and a second manner, the selection of one of the first manner and the second manner based upon at least an operation mode. Preferably, the data unit is processed in the first manner if the operation mode is one of unacknowledged mode (UM) and acknowledged mode (AM), and the data unit is processed in the second manner if the operation mode is transparent mode (TM).

According to one aspect of the invention, the first manner comprises discarding the data unit in the RLC layer. The second manner comprises checking whether an error handling scheme has been provided. If the error handling scheme is not provided, the data unit is discarded. If the error handling scheme is provided, then the data unit is processed according to the error handling scheme. Preferably, the error handling scheme comprises an instruction associated with a delivery of erroneous SDU. The delivery of erroneous SDU instruction indicates one of deliver an erroneous SDU to a higher layer with an error indication, discard an erroneous SDU, and deliver an erroneous SDU to a higher layer without an error indication.

According to another aspect of the invention, the data unit received from the MAC layer does not include a header information associated with the MAC layer. Alternatively, the data unit received from the MAC layer is associated with a logical channel that is mapped in a 1:1 ratio with a transport channel.

According to another embodiment of the invention, a receiver apparatus for processing data in a wireless communication system comprises: a medium access control (MAC) layer that transfers a data unit and a cyclic redundancy code (CRC) check result associated with the data unit; and a radio link control (RLC) layer in communication with the MAC layer, the RLC layer receiving from the MAC layer the data unit and the CRC check result, wherein the RLC layer examines the CRC check result sent from the MAC layer that indicates whether the data unit has an error, and discards the data unit when the data unit has error and when an error handling scheme is not provided.

According to another embodiment of the invention, a receiver apparatus comprises a medium access control (MAC) layer that transfers a data unit and a cyclic redundancy code (CRC) check result associated with the data unit; and a radio link control (RLC) layer in communication with the MAC layer, the RLC layer receiving from the MAC layer the data unit and the CRC check result, wherein the RLC layer examines the CRC check result sent from the MAC layer that indicates whether the data unit has an error, and processes the data unit in accordance with one of a first manner and a second manner, the selection of one of the first manner and the second manner based upon at least an operation mode.

According to still another embodiment of the invention, a method of processing data in a receiver apparatus used in a wireless communication system, the method comprising communicating a data unit and a cyclic redundancy code (CRC) check result associated with the data unit from the physical layer to the MAC layer; determining in the MAC layer that the CRC check result indicates the data unit has an error; examining the data unit for presence of header information associated with a MAC header; and discarding the data unit if the header information is present; checking whether an error handling scheme is provided if the header information is not present. Preferably, the data unit is discarded if the error handling scheme is not provided, and the data unit is processed according to the error handling scheme if the error handling scheme is provided.

According to another embodiment of the invention, a receiver apparatus for processing data in a wireless communication system comprises a physical layer that transfers a data unit and a cyclic redundancy code (CRC) check result associated with the data unit; and a medium access control (MAC) layer in communication with the physical layer, the MAC layer receiving from the physical layer the data unit and the CRC check result, wherein the MAC layer examines the CRC check result sent from the physical layer that indicates whether the data unit has an error, and further examines the data unit for presence of header information associated with a MAC header and discarding the data unit if the header information is present and checking whether an error handling scheme is provided if the header information is not present.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. Features, elements, and aspects of the invention that are referenced by the same numerals in different figures represent the same, equivalent, or similar features, elements, or aspects in accordance with one or more embodiments.

DETAILED DESCRIPTION OF THE PREFERRED EMBODIMENTS

The present invention relates to a data processing method for supporting an AMR codec that determines whether detected error data is related to a codec such that the error data is transferred to an upper layer only when it is related to the codec. The present invention allows the RLC layer or the MAC layer to prevent transfer, to the upper layer, of protocol data units having CRC errors that have been processed irrespective of the codec.

Figure 1:
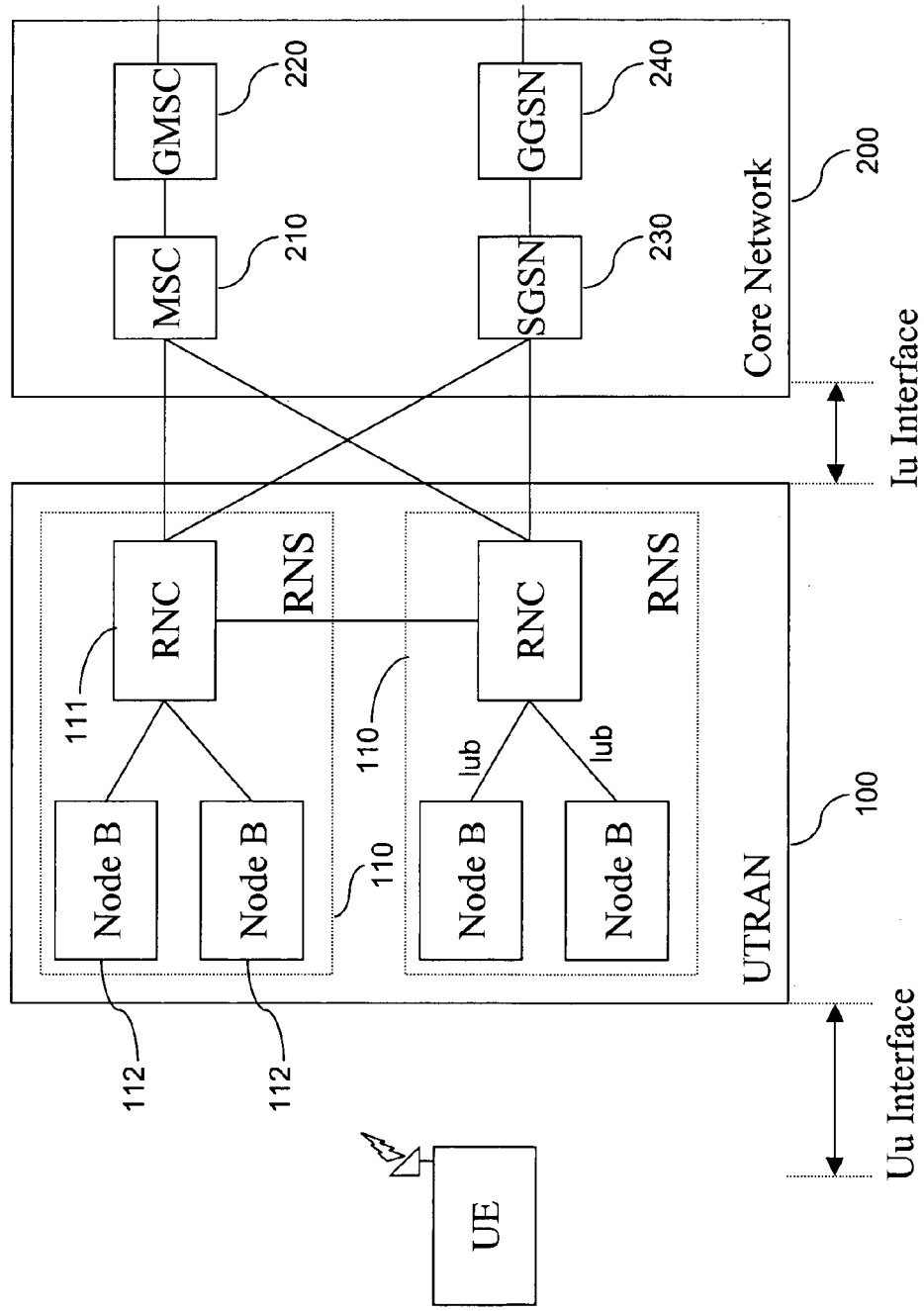
FIG. 1 illustrates the basic structure of a general UMTS network.
Figure 2:
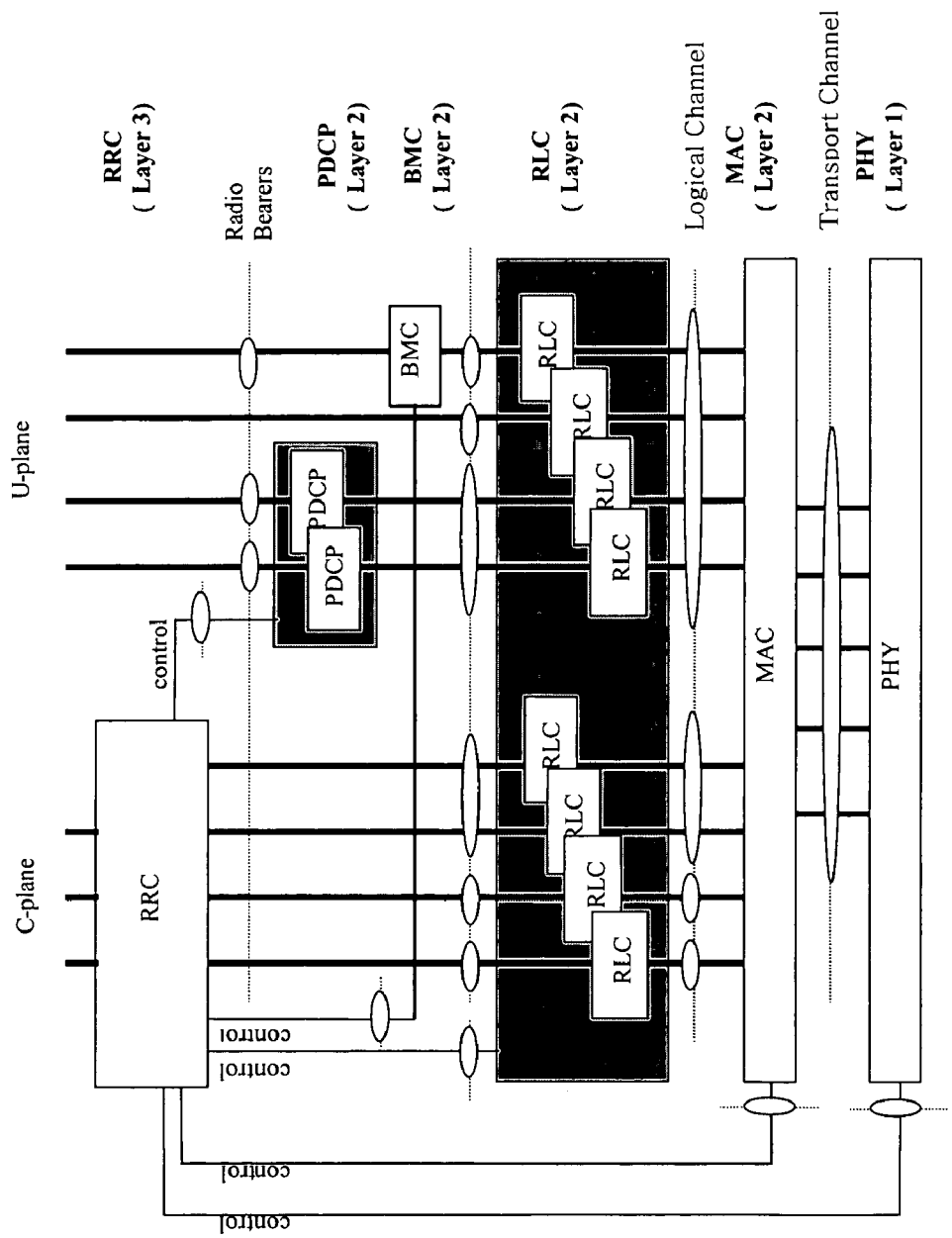
FIG. 2 illustrates a structure of a radio interface protocol between a terminal 50 and the UTRAN 100 according to the 3GPP radio access network standards.
Figure 3:
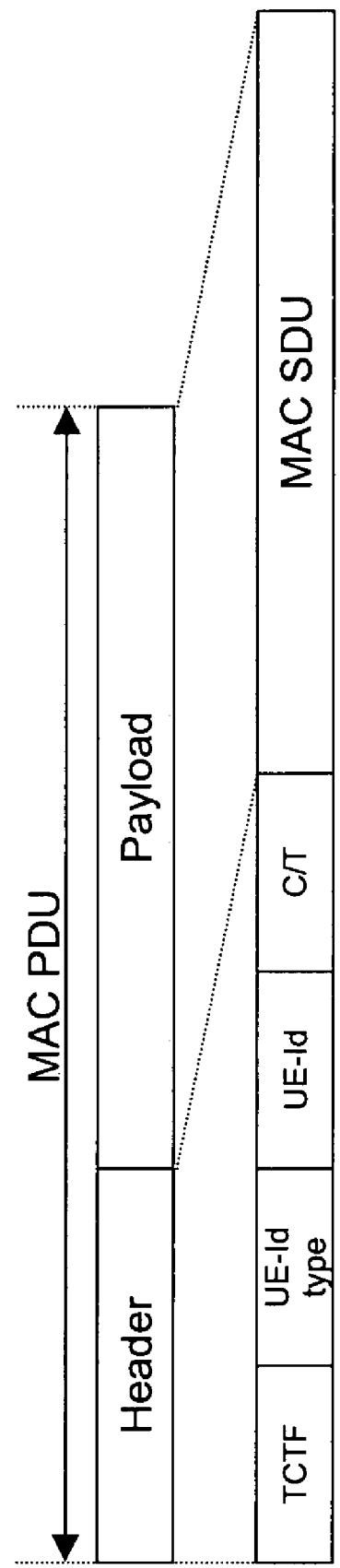
FIG. 3 illustrates a format of a MAC PDU.
Figure 4:
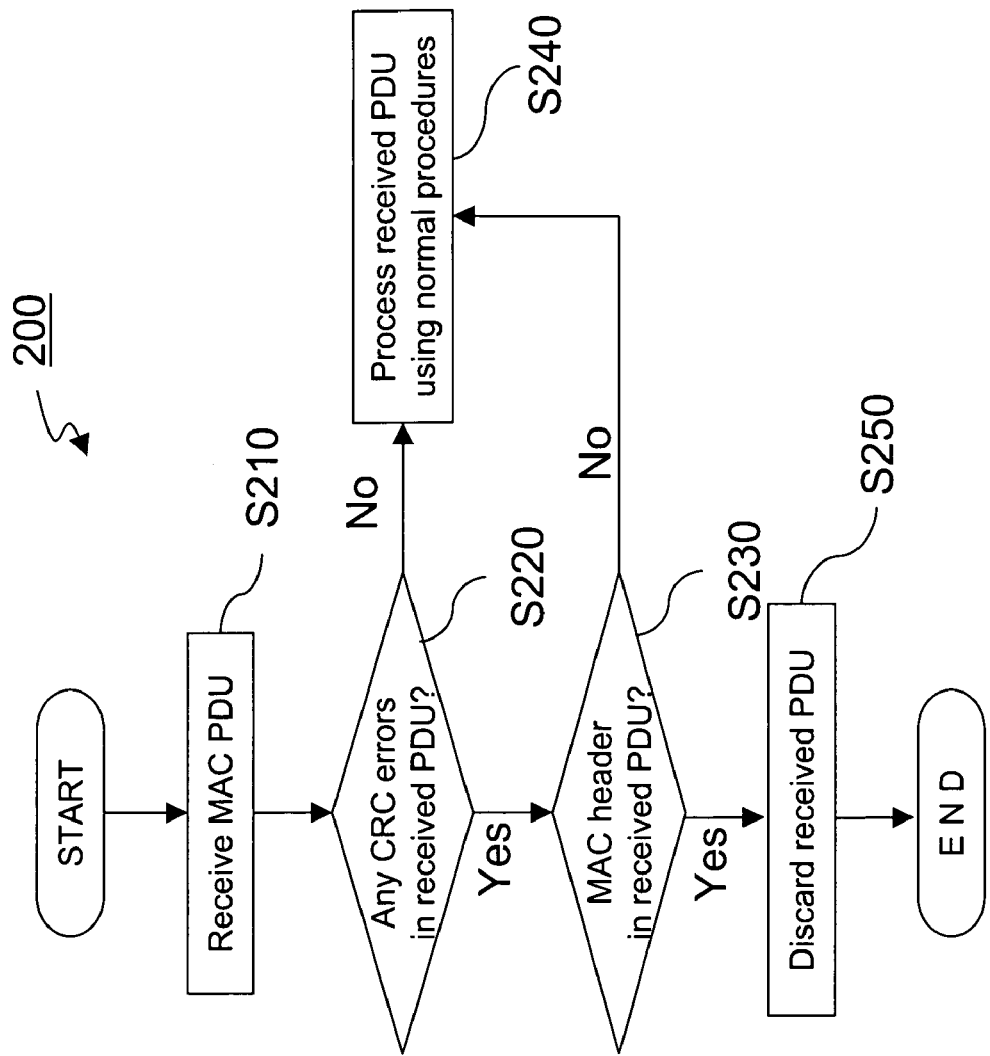
FIG. 4 illustrates a flow chart of a related art data processing method of the MAC layer.
Figure 5:
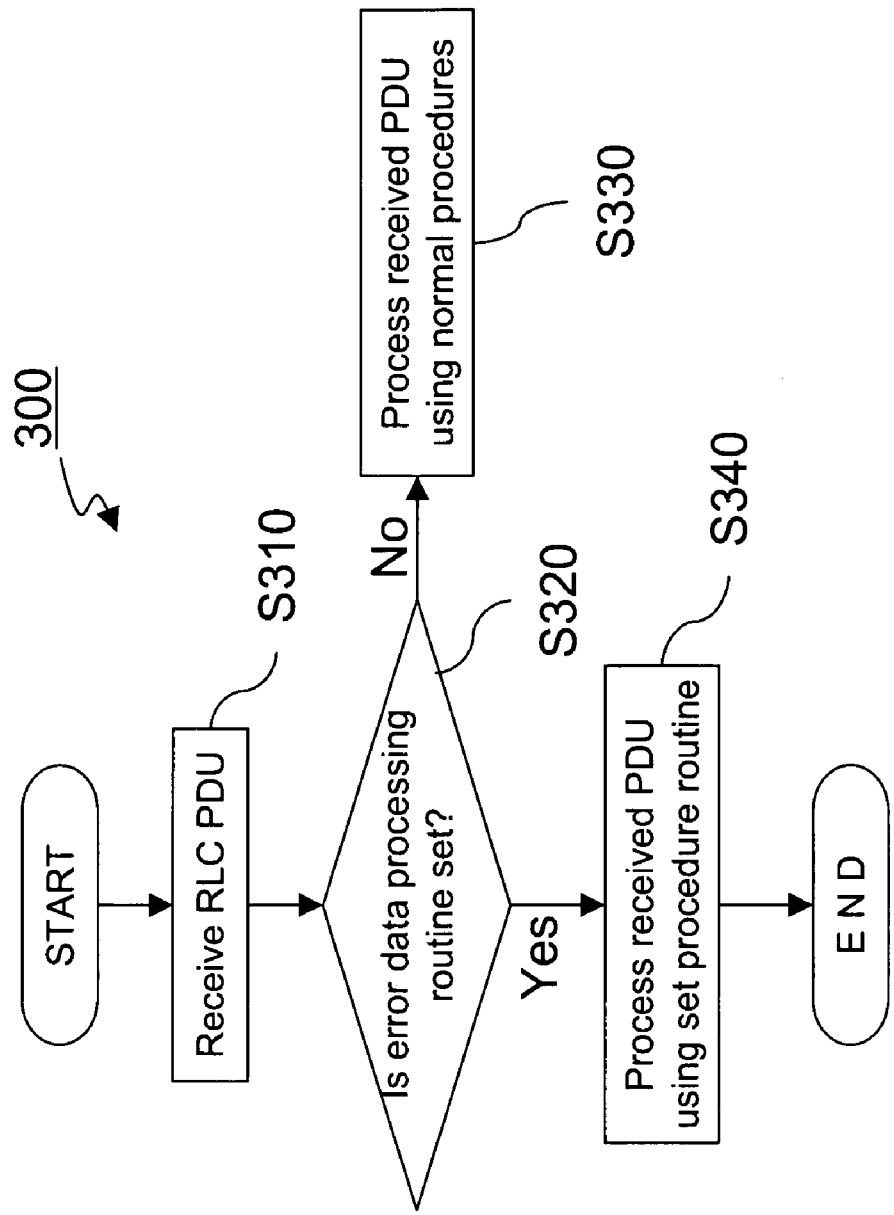
FIG. 5 illustrates a flow chart of a related art data processing method of the RLC layer.
Figure 6:
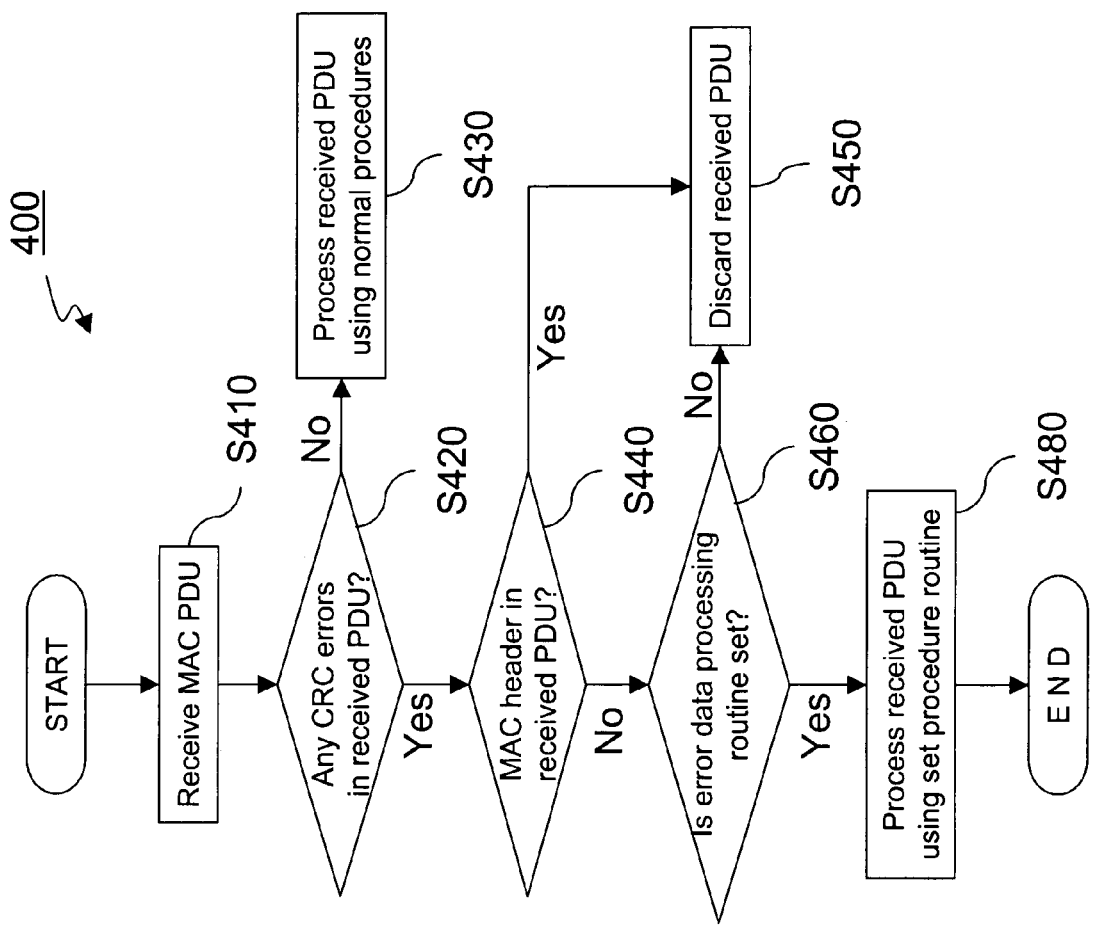
FIG. 6 illustrates a flow chart of a data processing in the MAC layer in accordance with a first embodiment of the present invention.

Referring to FIG. 6, a flow chart of a data processing method 400 in accordance with a first embodiment of the present invention is illustrated. Specifically, the method 400 is a data processing method of the MAC layer for supporting data associated with, for example, the speech codec, such as AMR. However, the present invention may be also applicable to data associated with real time data, stream data, data encoded with various types of codec, etc.

When a MAC PDU is received from a lower layer, such as a physical layer, (step S410), the MAC layer checks whether there is a CRC error in the received MAC PDU (step S420). If there is no error in the received MAC PDU, the MAC layer processes the received MAC PDU according to a normal processing procedure (step S430). If there is an error in the MAC PDU, the MAC layer checks whether there is a MAC header in the received MAC PDU (step S440).

If there is a MAC header in the MAC PDU, the MAC layer discards the MAC PDU (step S450). If there is no MAC header in the MAC PDU, the MAC layer checks whether an error handling scheme (for example, instruction or parameter related to delivery of erroneous SDUs or data units) for processing error data has been set (step S460). The absence of a MAC header means that the mapping of the transport channel and the logical channel at a 1:1 ratio. In other words, there is no multiplexing of multiple logical channels into one transport channel. Because of such relationship, the MAC header is not necessary since the MAC header identifies a plurality of logical channel data mapped into, for example, one transport channel.

If the error handling scheme is not set or, alternatively, not configured, the MAC layer discards the received MAC PDU (step S450). If the error handling scheme has been set, the MAC layer processes the received MAC PDU according to a set error data processing procedure (step S480).

If the error handling scheme for processing the error data has been set, the state of the error handling scheme (for example, yes; no; no detect) provides instructions to the MAC layer. There are three possible error handling schemes; deliver the data unit to a higher layer with an error indication, discard the data unit, and deliver the data unit to a higher layer without an error indication.

Accordingly, if the data contains a CRC error, only the data that the upper layer requests is processed according to the set error data processing procedure and transferred to the RLC layer. If there is a CRC error in the received data, the MAC layer determines whether the received data is related to the AMR codec. The MAC layer transfers the received data to the RLC layer preferably when the data is related to the AMR codec. This is because the data related to the AMR codec or speech data is preferably mapped from a logical channel to a transport channel (which is preferably performed in the MAC layer) in a 1:1 ratio, thus eliminating the need for a MAC header information.

Figure 7:
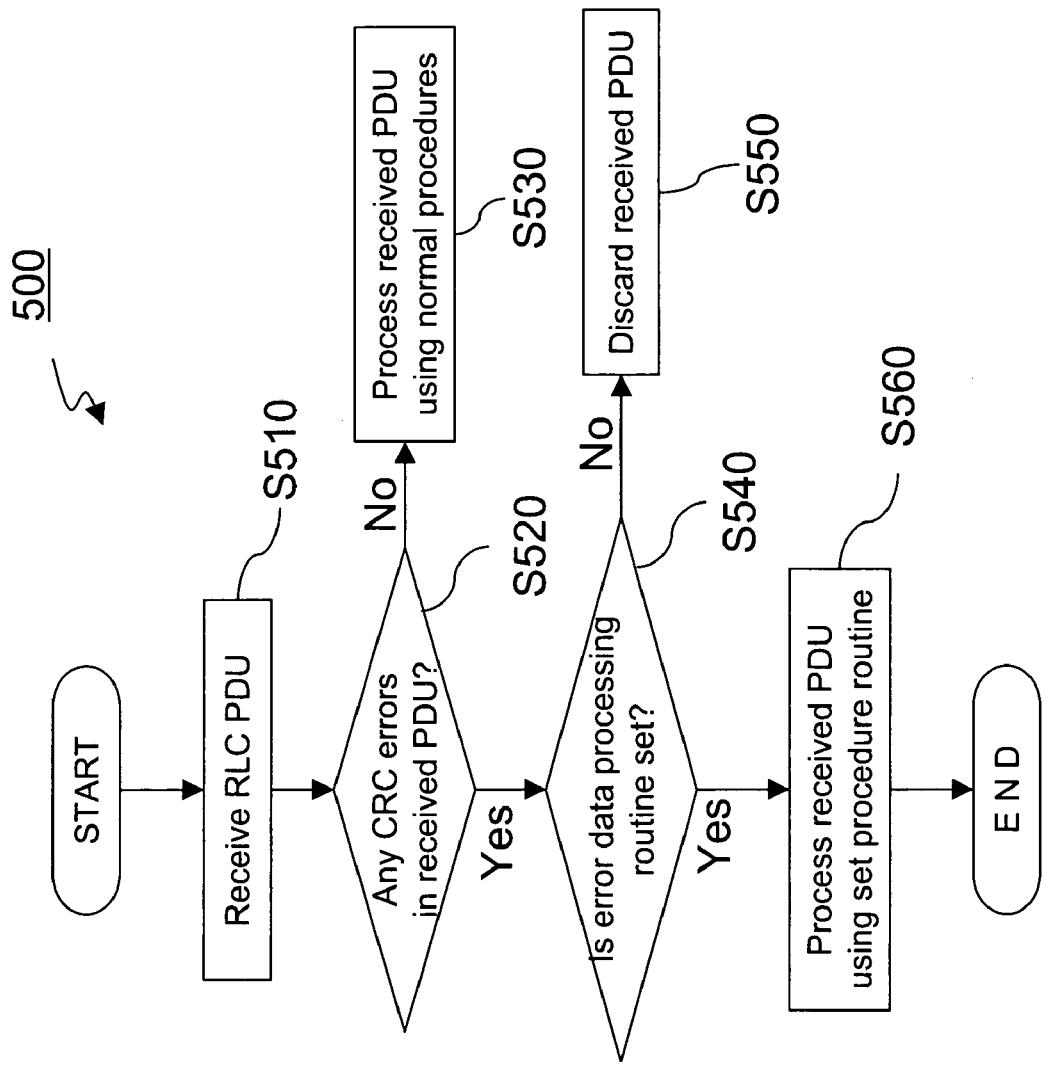
FIG. 7 illustrates a flow chart of a data processing in the RLC layer in accordance with a second embodiment of the present invention.

Referring to FIG. 7, a flow chart of a data processing method 500 in the RLC layer in accordance with a second embodiment of the present invention is illustrated. Specifically, the method 500 is a data processing method of the RLC layer for supporting data associated with the speech codec, such as AMR.

When an RLC PDU is received from the MAC layer (step S510), the RLC layer examines the CRC check result to determine whether there is error in the received RLC PDU (step S520). If there is no error in the RLC PDU, the RLC layer processes the received RLC PDU according to a normal processing procedure (step S530). If there is error in the received RLC PDU, the RLC layer checks whether an error handling scheme (for example, instruction or parameter related to delivery of erroneous SDUs or data units) for processing error data has been set (step S540).

If the error handling scheme has not been set or, alternatively, not configured, in the RLC layer, the RLC layer discards the received RLC PDU (step S550). If the error handling scheme has been set, the RLC layer processes the received RLC PDU according to the set error data processing procedure (step S560).

If the error handling scheme for processing the error data has been set, the state of the error handling scheme (for example, yes; no; no detect) provides instructions to the RLC layer. There are three possible error handling schemes; deliver the data unit to a higher layer with an error indication, discard the data unit, and deliver the data unit to a higher layer without an error indication.

It should be noted that the checking of the 'error data processing procedure' of the environment set up might be omitted in certain circumstances. This is because the data transferred to the AMR codec is transferred via the DTCH among the logical channels, and of the three types of modes, the RLC only operates in TM. Namely, if the RLC operates in TM and when a PDU is received through a logical channel other than the DTCH, or if the RLC operates in AM or UM and the PDU is received via any logical channel, the RLC may discard the error data simultaneously upon receipt thereof. Here, it can be considered that the 'error data processing procedure' is set to be an 'error data discard procedure,' and thus the environment set up for such situations is not necessary.

Accordingly, if the data contains a CRC error, only the data that the upper layer (such as RRC layer) requests is processed according to the set error data processing procedure and transferred to the RLC layer. If there is a CRC error in the received data, the RLC layer determines whether the received data is related to the AMR codec. The MAC layer transfers the received data to the RLC layer only when the data is related to the AMR codec. This is because the data related to the AMR codec or speech data is preferably mapped from a logical channel to a transport channel (which is preferably performed in the MAC layer) in a 1:1 ratio, thus eliminating the need for a MAC header information. Also, the speech data may be either partially or fully recovered in a receiver device despite error contained therein by using certain decoding process.

Figure 8:
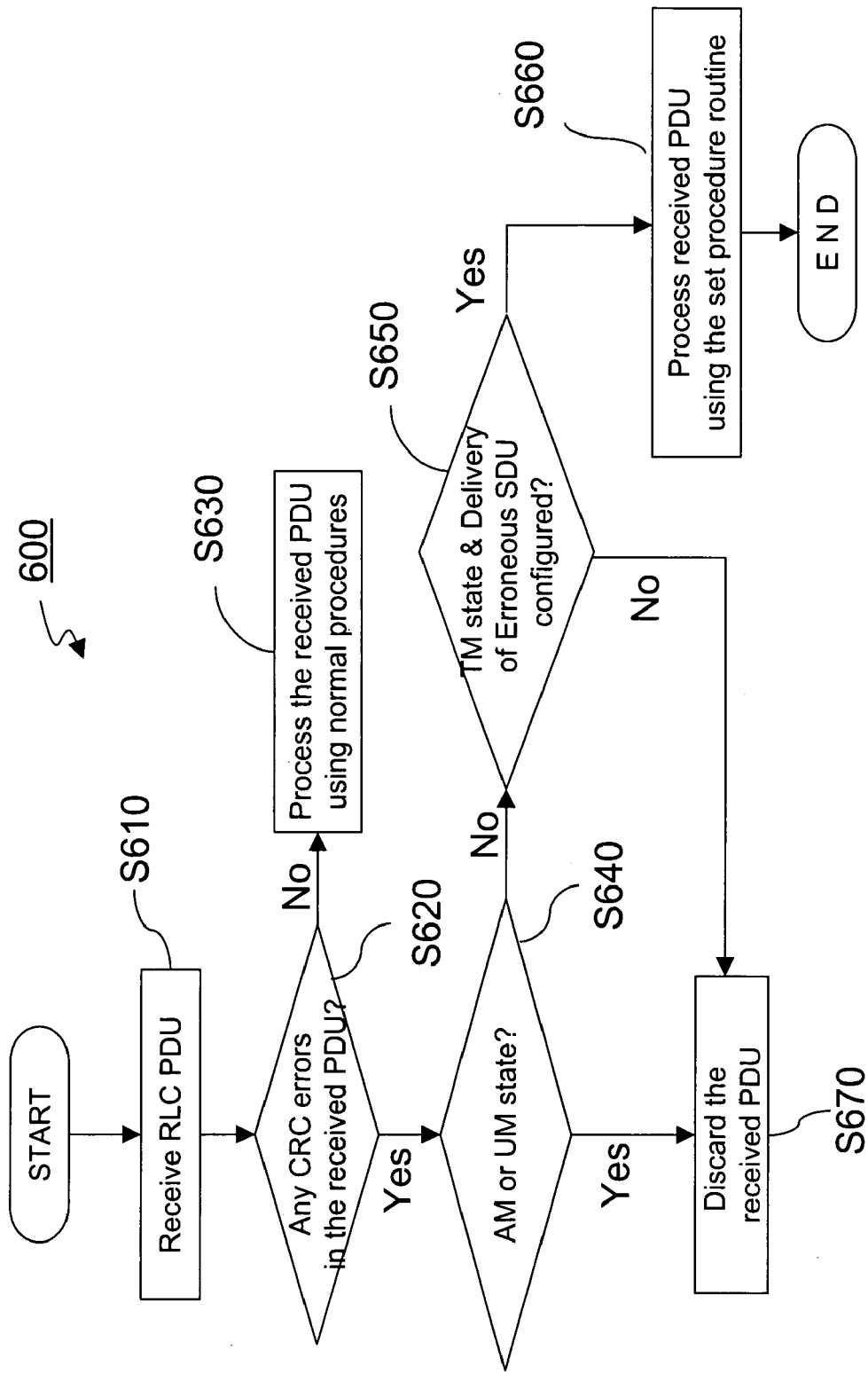
FIG. 8 illustrates a flow chart of a data processing in the RLC layer in accordance with a third embodiment of the present invention.

FIG. 8 illustrates a flow chart of a data processing method 600 in the RLC layer in accordance with a third embodiment of the present invention.

When an RLC PDU is transferred to the RLC layer from the MAC layer (step S610), the RLC layer examines the CRC check result to determine whether there is error in the received RLC PDU (step S620). If there is no error in the RLC PDU, the RLC layer processes the received RLC PDU according to a normal processing procedure (step S630). If there is error in the received RLC PDU, the RLC layer checks whether the present state is AM or UM state (step S640). If either the AM or UM state, the RLC layer discards the PDU received from the MAC layer (step S670). If the RLC layer is in the TM state and the error handling scheme (for example, delivery of erroneous SDUs) is configured the RLC layer processes the PDU according to predetermined error data processing procedure (step S660). If the error handling scheme is not configured, then the RLC layer discards the received RLC PDU (step S670).

If the error handling scheme for processing the error data has been set, the state of the error handling scheme provides instructions to the RLC layer. Similar to the above, there are three possible error handling scheme states; deliver the data unit to a higher layer with an error indication, discard the data unit, and deliver the data unit to a higher layer without an error indication.

Figure 9:
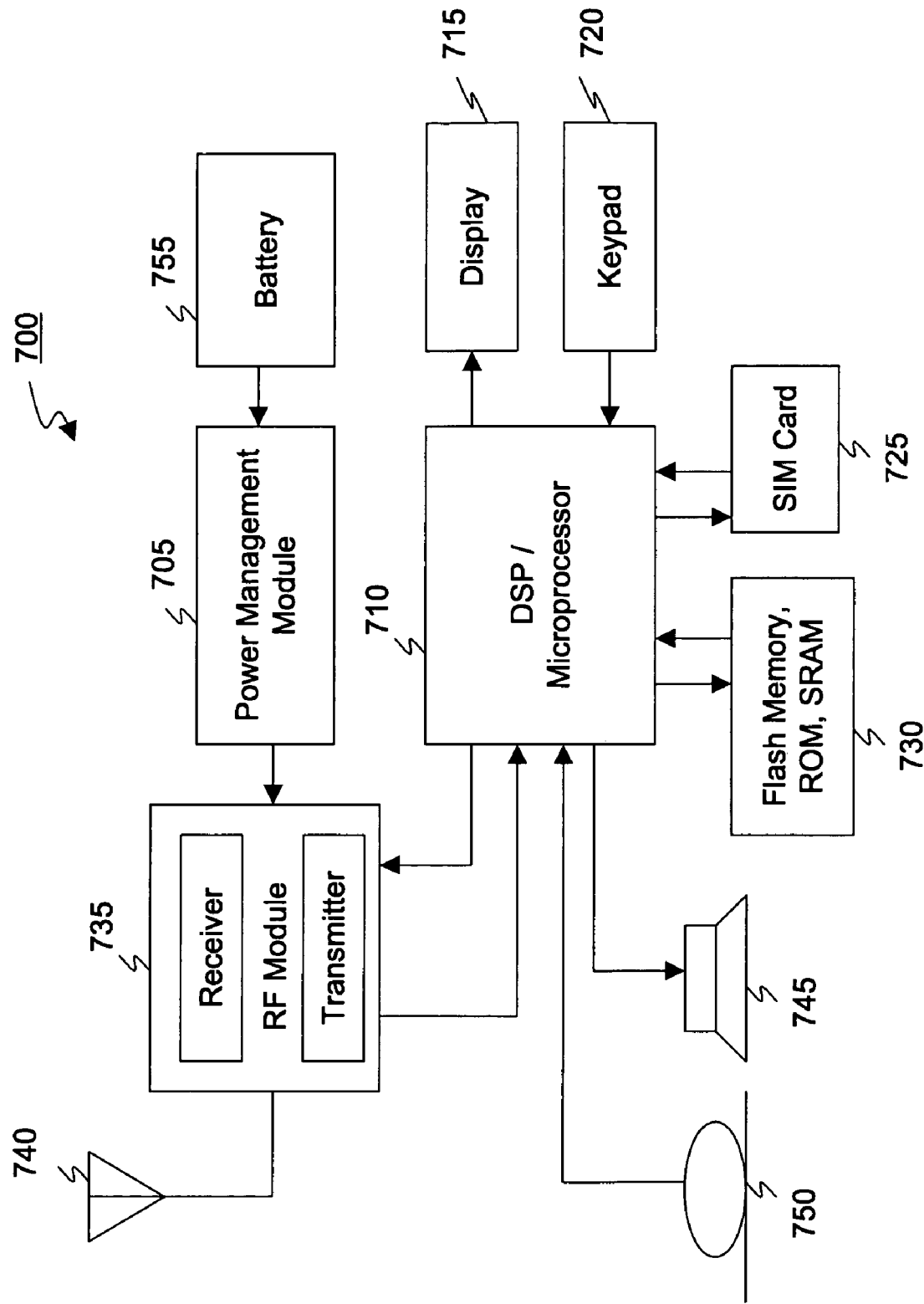
FIG. 9 illustrates a block diagram of mobile station according to the preferred embodiment of the present invention.

FIG. 9 illustrates a block diagram of mobile station according to the preferred embodiment of the present invention. Both the mobile station and the network system may utilize the present invention. Referring to FIG. 9, the mobile station 700 comprises a processor (or digital signal processor) 710, RF module 735, power management module 705, antenna 740, battery 755, display 715, keypad 720, memory 730, SIM card 725 (which may be optional), speaker 745 and microphone 750.

A user enters instructional information, such as a telephone number, for example, by pushing the buttons of a keypad 720 or by voice activation using the microphone 750. The microprocessor 710 receives and processes the instructional information to perform the appropriate function, such as to dial the telephone number. Operational data may be retrieved from the Subscriber Identity Module (SIM) card 725 or the memory module 730 to perform the function. Furthermore, the processor 710 may display the instructional and operational information on the display 715 for the user's reference and convenience.

The processor 710 issues instructional information to the RF section 735, to initiate communication, for example, transmit radio signals comprising voice communication data. The RF section 735 comprises a receiver and a transmitter to receive and transmit radio signals. An antenna 740 facilitates the transmission and reception of radio signals. Upon receiving radio signals, the RF module 735 may forward and convert the signals to baseband frequency for processing by the processor 710. The processed signals would be transformed into audible or readable information outputted via the speaker 745, for example.

It will be apparent to one skilled in the art that the preferred embodiments of the present invention can be readily implemented using, for example, the processor 710 or other data or digital processing device, either alone or in combination with external support logic.

Although the present invention is described in the context of mobile communication, the present invention may also be used in any wireless communication systems using mobile devices, such as PDAs and laptop computers equipped with wireless communication capabilities. Moreover, the use of certain terms to describe the present invention should not limit the scope of the present invention to certain type of mobile communication system, such as cdma2000. The present invention is also applicable to other wireless communication systems using different air interfaces and/or physical layers, for example, TDMA, CDMA, FDMA, WCDMA, etc.

The preferred embodiments may be implemented as a method, apparatus or article of manufacture using standard programming and/or engineering techniques to produce software, firmware, hardware, or any combination thereof. The term "article of manufacture" as used herein refers to code or logic implemented in hardware logic (e.g., an integrated circuit chip, Field Programmable Gate Array (FPGA), Application Specific Integrated Circuit (ASIC), etc.) or a computer readable medium (e.g., magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.). Code in the computer readable medium is accessed and executed by a processor. The code in which preferred embodiments are implemented may further be accessible through a transmission media or from a file server over a network. In such cases, the article of manufacture in which the code is implemented may comprise a transmission media, such as a network transmission line, wireless transmission media, signals propagating through space, radio waves, infrared signals, etc. Of course, those skilled in the art will recognize that many modifications may be made to this configuration without departing from the scope of the present invention, and that the article of manufacture may comprise any information bearing medium known in the art.

The logic implementation shown in the figures described specific operations as occurring in a particular order. In alternative implementations, certain of the logic operations may be performed in a different order, modified or removed and still implement preferred embodiments of the present invention. Moreover, steps may be added to the above described logic and still conform to implementations of the invention.

As so far described, the data processing methods of the present invention have the following advantages. The problem of the conventional art, regarding malfunction at the RRC layer and the RLC layer caused by transferring data containing error to an upper layer without considering whether the data is for AMR codec, is alleviated. Furthermore, the efficiency of wired/wireless resources can be improved and wired/wireless resources can be effectively managed.

The foregoing embodiments and advantages are merely exemplary and are not to be construed as limiting the present invention. The present teachings can be readily applied to other types of methods and apparatuses. The description of the present invention is intended to be illustrative, and not to limit the scope of the claims. Many alternatives, modifications, and variations will be apparent to those skilled in the art. In the claims, means-plus-function clauses are intended to cover the structure described herein as performing the recited function and not only structural equivalents but also equivalent structures.

What is claimed is:

1. A method of processing data in a receiver apparatus used in a wireless communication system, the receiver apparatus comprising a medium access control (MAC) layer and a radio link control (RLC) layer for processing data units, the method comprising:
    communicating a data unit and a cyclic redundancy code (CRC) check result associated with the data unit from the MAC layer to the RLC layer;
    determining in the RLC layer that the CRC check result indicates the data unit has an error; and
    processing the data unit in accordance with either a first manner or a second manner, the selection of either the first manner or the second manner based upon at least an operation mode, wherein the second manner comprises:
        determining whether a predetermined procedure for processing the erroneous data unit at the RLC layer is configured,
        if a predetermined procedure for processing the erroneous data unit at the RLC layer is configured, then further determining the configuration of a preset value associated with the predetermined procedure and processing the data unit in accordance with the preset value,
        if a predetermined procedure for processing the erroneous data unit at the RLC layer is not configured, then discarding the data unit at the RLC layer.

2. The method of claim 1, wherein the data unit is processed in accordance with the first manner if the operation mode is one of unacknowledged mode (UM) or acknowledged mode (AM).

3. The method of claim 1, wherein the data unit is processed in the second manner if the operation mode is transparent mode (TM).

4. The method of claim 1, wherein the first manner comprises discarding the data unit in the RLC layer.

5. A receiver apparatus for processing data in a wireless communication system, the receiver apparatus comprising:
    a medium access control (MAC) layer that transfers a data unit and a cyclic redundancy code (CRC) check result associated with the data unit; and
    a radio link control (RLC) layer in communication with the MAC layer, the RLC layer adapted to receive from the MAC layer the data unit and the CRC check result that indicates whether the data unit has an error, and adapted to examine the CRC check result sent from the MAC layer and process the data unit in accordance with either a first manner or a second manner, the selection of either the first manner or the second manner based upon at least an operation mode, wherein the second manner comprises:
        determining whether a predetermined procedure for processing the data unit at the RLC layer is configured, where the CRC check result indicates that the data unit has an error,
        if a predetermined procedure for processing an erroneous data unit at the RLC layer is configured, then further determining the configuration of a preset value associated with the predetermined procedure and processing an erroneous data unit in accordance with the preset value, and
        if a predetermined procedure for processing an erroneous data unit at the RLC layer is not configured, then discarding the erroneous data unit at the RLC layer.

6. A method of processing data in a receiver apparatus used in a wireless communication system, the receiver apparatus comprising a physical layer and a medium access control (MAC) layer for processing data units, the method comprising:
    communicating a data unit and a cyclic redundancy code (CRC) check result associated with the data unit from the physical layer to the MAC layer;
    determining in the MAC layer that the CRC check result indicates the data unit has an error;
    examining the data unit for presence of header information associated with a MAC header;
    discarding the data unit if the header information is present; and
    if the header is not present, then determining whether a predetermined procedure for processing the erroneous data unit at the RLC layer is configured,
    if a predetermined procedure for processing the erroneous data unit at the RLC layer is configured, then further determining the configuration of a preset value associated with the predetermined procedure and processing the data unit in accordance with the preset value, if a predetermined procedure for processing the erroneous data unit at the RLC layer is not configured, then discarding the data unit at the RLC layer.

7. In a wireless communication system that includes a medium access control (MAC) layer and a radio link control (RLC) layer, a method comprising:

communicating a data unit and a cyclic redundancy code (CRC) check result corresponding to the data unit from the MAC layer to the RLC layer;

at the RLC layer, determining whether there is any error associated with the data unit based on the CRC check result;

if it is determined that the data unit contains an error, then determining whether a predetermined procedure for processing the erroneous data unit at the RLC layer is configured, and if a predetermined procedure for processing the erroneous data unit at the RLC layer is configured, then further determining the configuration of a preset value associated with the predetermined procedure and processing the data unit in accordance with the preset value; and if a predetermined procedure for processing the erroneous data unit at the RLC layer is not configured, then discarding the data unit at the RLC layer.

8. The method of claim 7 further comprising:

transporting the data unit from the RLC layer to a next higher layer for further processing if, at the RLC layer, it is determined that there is no error associated with the data unit.

9. The method of claim 8, wherein the next higher layer is a Radio Resource Control (RRC) layer.

10. The method of claim 7, wherein the data unit is an RLC protocol data unit.

11. In a wireless communication system that includes a medium access control (MAC) layer and a radio link control (RLC) layer, and wherein the RLC layer is capable of operating in one of several modes, a method comprising:

communicating a data unit and a cyclic redundancy code (CRC) check result corresponding to the data unit from the MAC layer to the RLC layer;

at the RLC layer, determining whether there is an error associated with the data unit based on the CRC check result; and if it is determined that there is an error associated with the data unit and the RLC layer is operating in accordance with a first one of the modes, then determining whether a predetermined procedure for processing the erroneous data unit at the RLC layer is configured; and if the predetermined procedure for processing the erroneous data unit at the RLC layer is configured, then further determining a preset value associated with the predetermined procedure, and if the predetermined procedure for processing the erroneous data unit at the RLC layer is not configured, then discarding the data unit at the RLC layer, regardless of the RLC mode.

12. The method of claim 11, wherein the RLC layer is operating in transparent mode, said method further comprising:

processing the data unit at the RLC layer in accordance with the preset value if there is an error associated with the data unit and if a predetermined procedure for processing erroneous data units at the RLC layer is configured.

13. The method of claim 12 further comprising:

submitting only RLC data units, received at the RLC layer without error, to a next higher layer if the preset value associated with the predetermined procedure has a first configuration value.

14. The method of claim 13, wherein the first configuration value is "NO."

15. The method of claim 12 further comprising:

submitting all RLC data units to a next higher layer and providing an error indication if a corresponding data unit is received at the RLC in error and if the preset value associated with the predetermined procedure has a second configuration value.

16. The method of claim 15, wherein the second configuration value is "YES."

17. The method of claim 12 further comprising:

submitting all RLC data units to a next higher layer if the preset value associated with the predetermined procedure has a third configuration value.

18. The method of claim 17, wherein the third configuration value is "NO DETECT."

19. The method of claim 11, wherein the RLC is operating in unacknowledged mode or acknowledged mode, said method further comprising:

discarding the data unit at the RLC layer if, at the RLC layer, it is determined that there is an error associated with the data unit, regardless whether a predetermined procedure for processing the data unit at the RLC layer is configured.

* * * * *